(12) United States Patent
Brien et al.

(10) Patent No.: US 6,397,990 B1
(45) Date of Patent: Jun. 4, 2002

(54) MATERIALS TRANSPORT SYSTEM HAVING INDUCTIVE POWER TRANSFER

(75) Inventors: Richard M. Brien, Methuen; Mitchell Weiss, Carlise, both of MA (US)

(73) Assignee: PRI Automation, Inc., Billerica, MA (US)

( * ) Notice: Subject to any disclaimer, the term of this patent is extended or adjusted under 35 U.S.C. 154(b) by 0 days.

(21) Appl. No.: 09/300,947

(22) Filed: Apr. 28, 1999

Related U.S. Application Data

(60) Provisional application No. 60/104,943, filed on Oct. 20, 1998.

(51) Int. Cl.[7] ................................................. B60L 9/00
(52) U.S. Cl. ........................................ 191/10; 104/292
(58) Field of Search ............................ 104/88.04, 118, 104/292, 290; 198/619; 191/10

(56) References Cited

U.S. PATENT DOCUMENTS

| | | | | |
|---|---|---|---|---|
| 3,594,622 A | * | 7/1971 | Inagaki ........................ 318/135 |
| 3,782,292 A | * | 1/1974 | Metcalf ........................ 104/130 |
| 3,815,511 A | * | 6/1974 | Dukowicz et al. ... 104/148 LM |
| 3,827,371 A | * | 8/1974 | Onoda .................. 104/148 LM |
| 4,303,870 A | * | 12/1981 | Nakamura et al. ........... 318/135 |
| 4,331,225 A | * | 5/1982 | Bolger ......................... 191/10 |
| 4,624,617 A | * | 11/1986 | Belna ........................ 414/347 |
| 4,686,435 A | * | 8/1987 | Heidelberg et al. ......... 318/135 |
| 4,836,344 A | * | 6/1989 | Bolger ......................... 191/10 |
| 4,841,869 A | * | 6/1989 | Takeuchi et al. ............ 104/292 |
| 4,926,753 A | | 5/1990 | Weiss .......................... 104/88 |
| 5,029,754 A | | 7/1991 | Fränkel ....................... 239/166 |
| 5,033,391 A | | 7/1991 | Watanabe ................... 104/23.2 |
| 5,189,961 A | * | 3/1993 | Fujie ........................... 104/281 |
| 5,311,973 A | * | 5/1994 | Tseng et al. .................. 191/10 |
| 5,551,350 A | * | 9/1996 | Yamada et al. .............. 104/293 |
| 5,573,090 A | | 11/1996 | Ross ............................ 191/10 |
| 5,669,470 A | * | 9/1997 | Ross ............................ 191/10 |
| 5,696,689 A | | 12/1997 | Okumura et al. ...... 364/468.28 |
| 5,709,291 A | | 1/1998 | Nishino et al. ............... 191/10 |
| 5,770,936 A | | 6/1998 | Hirai et al. .................. 318/538 |
| 5,798,622 A | | 8/1998 | Hirai et al. ................... 318/16 |
| 5,821,728 A | * | 10/1998 | Schwind ..................... 320/108 |
| 5,855,261 A | * | 1/1999 | Odachi et al. ................ 191/10 |

FOREIGN PATENT DOCUMENTS

| | | | | |
|---|---|---|---|---|
| GB | 2133757 | * | 8/1984 | ................. 104/292 |
| JP | 0041606 | * | 2/1990 | ................. 104/292 |

* cited by examiner

Primary Examiner—S. Joseph Morano
Assistant Examiner—Frantz F. Jules
(74) Attorney, Agent, or Firm—Weingarten, Schurgin, Gagnebin & Lebovici LLP

(57) ABSTRACT

An inductive power transfer apparatus is provided which is especially useful for a semiconductor wafer handling system or other similar type of materials transport system in which one or more cars are moveable along a track. The system includes a plurality of elongated primary coils each disposed at an intended position along the track. Each of the moveable cars has one or more pick-up or secondary coils which are coupled to the primary coil when the car comes into position along the track. A secondary coil or coils on the car provides power to a battery charging circuit for so long as the secondary is in coupling relationship with the primary or for so long as needed to provide an intended charge to the on board batteries. A drive circuit for the primary coil may be located near the primary coil or alternatively, a single drive circuit can be at a central location to provide drive signals to a plurality of primary coils. The drive circuit can be activated by sensing the presence of a secondary coil in coupling position with the primary coil. The charge current can be controlled to suit the characteristics or charge status of the batteries.

26 Claims, 5 Drawing Sheets

MATERIALS TRANSPORT SYSTEM HAVING INDUCTIVE POWER TRANSFER

CROSS REFERENCE TO RELATED APPLICATIONS

This application claims priority under 35 U.S.C. §119(e) to provisional patent application serial No. 60/104,943 filed Oct. 20, 1998; the disclosure of which is incorporated by reference.

STATEMENT REGARDING FEDERALLY SPONSORED RESEARCH OR DEVELOPMENT

Not Applicable

BACKGROUND OF THE INVENTION

This invention relates to materials transport systems and more particularly to a system for moving semiconductor wafers or other materials to various locations along a track and having inductive power transfer from the track to cars moveable along the track.

Computer controlled materials transport systems are known for moving materials among various work stations of a facility. Such systems are employed, as an example, in semiconductor fabrication facilities for moving semiconductor wafers to successive work stations. In such a wafer transport system, a monorail track is routed past the work stations and a plurality of cars are mounted on the track and moveable there-along for delivering wafers to successive work stations and for removing wafers therefrom after requisite processing operations have been accomplished. The track is composed of interconnected track sections which usually include one or more routing sections or modules which are operative to provide plural paths along the track. The car includes one or more motors coupled to drive wheels which in turn engage the track for propelling the car along the track. Electronic circuitry governed by an on board micro-controller controls operation of the car in response to control signals provided from a central control point or multiple control points within the facility. A battery or battery pack is contained on board the car for powering the motors and associated circuitry. A materials transport system used for semiconductor wafer transport and other materials is described in U.S. Pat. No. 4,926,753 which is assigned to the same Assignee as the present invention.

The battery on board the moveable cars must be periodically charged to maintain their effectiveness. Heretofore such charging has been accomplished at predetermined positions along a track at which a car is stopped and at which position the battery of the car is coupled to a charging source by electrical contacts which are engaged when the car is at the stationary charging position. The electrical contacts can become worn or contaminated over time, and as a result performance is degraded. The contacts are also a source of electrical interference which can affect surrounding electronic equipment.

BRIEF SUMMARY OF THE INVENTION

In accordance with this invention an inductive power transfer apparatus is provided which is especially useful for a semiconductor wafer handling system or other similar type of materials transport system in which one or more cars are moveable along a track. This system includes a plurality of elongated primary transformer coils each disposed at an intended position along the track. Each of the moveable cars has one or more pick-up or secondary coils which are coupled to the primary coil when the car comes into position along the track. The secondary coil or coils on the car provides power to a battery charging circuit for so long as the secondary is in coupling relationship with the primary or for so long as needed to provide an intended charge to the on board batteries or other energy source. A drive circuit for the primary coil may be located near the primary coil or alternatively, a single drive circuit can be at a central location to provide drive signals to a plurality of primary coils.

Preferably the drive circuit is inactive when the secondary coil is not in coupling relationship with the primary coil and the drive circuit is rendered active when the secondary is in coupled relationship with the primary coil. The drive circuit is powered from a DC source and provides a pulse or other non-DC wave shape to drive the primary coil. In one embodiment the primary coil is controlled by a signal from the secondary or from a separate detector to provide feedback control of the charging cycle. A detector can be provided in association with the primary coil to detect the presence of the secondary coil to thereby energize the primary coil for power transfer. Intelligent control can be provided such that the secondary can determine how much charge is needed for the associated battery, and control signals applied to the primary circuit to govern the pulse rate of the primary power drive and thereby determine the amount and duration of power that is provided by the primary coil to the secondary coil and thence to the battery.

DETAILED DESCRIPTION OF THE INVENTION

Figure 1:
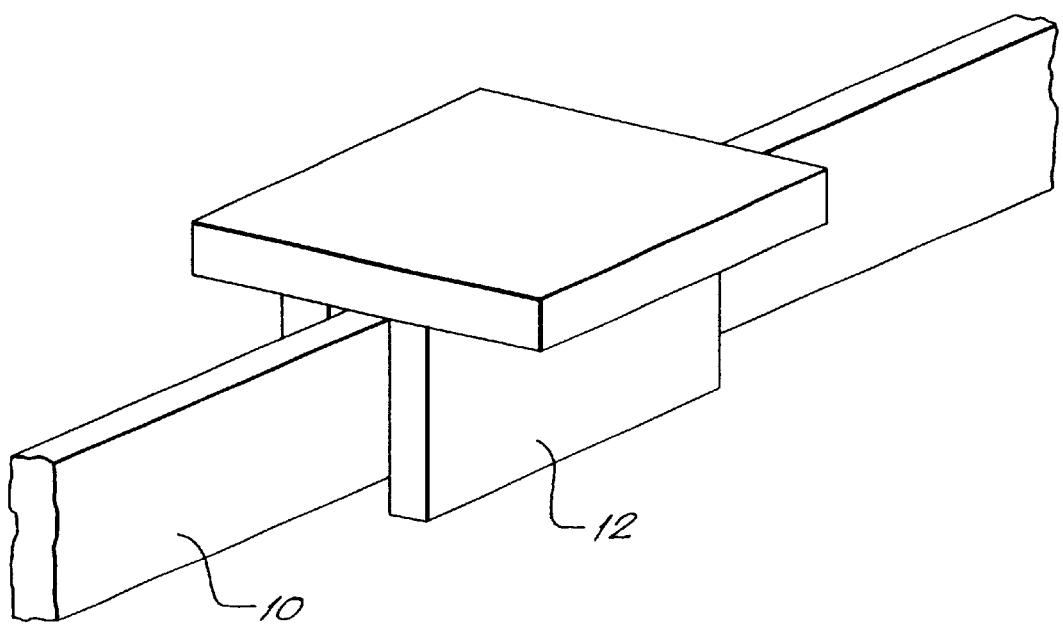
FIG. 1 is a cutaway pictorial view illustrating a monorail track and car of a system in which the invention is useful.

Referring to FIG. 1, there is shown a portion of a wafer handling system for transporting semiconductor wafers between stations in a semiconductor manufacturing facility. The system includes a monorail track 10 disposed along one or more predetermined pathways and having electrically powered cars 12 riding on the track. The cars are operative to carry wafer cassettes among stations of a manufacturing facility. The track is usually composed of a plurality of modular sections which are interconnected by routing modules which are operative to interconnect track sections to provide flexible and efficient routing of the cars along desired paths. The track and car system can be, for example, like that shown in U.S. Pat. No. 4,926,753 noted above.

One or more charging stations are provided along the track each operative to provide inductive power transfer from the charging station to a car positioned at the station for recharging of the battery power source on board the car.

Figure 2:
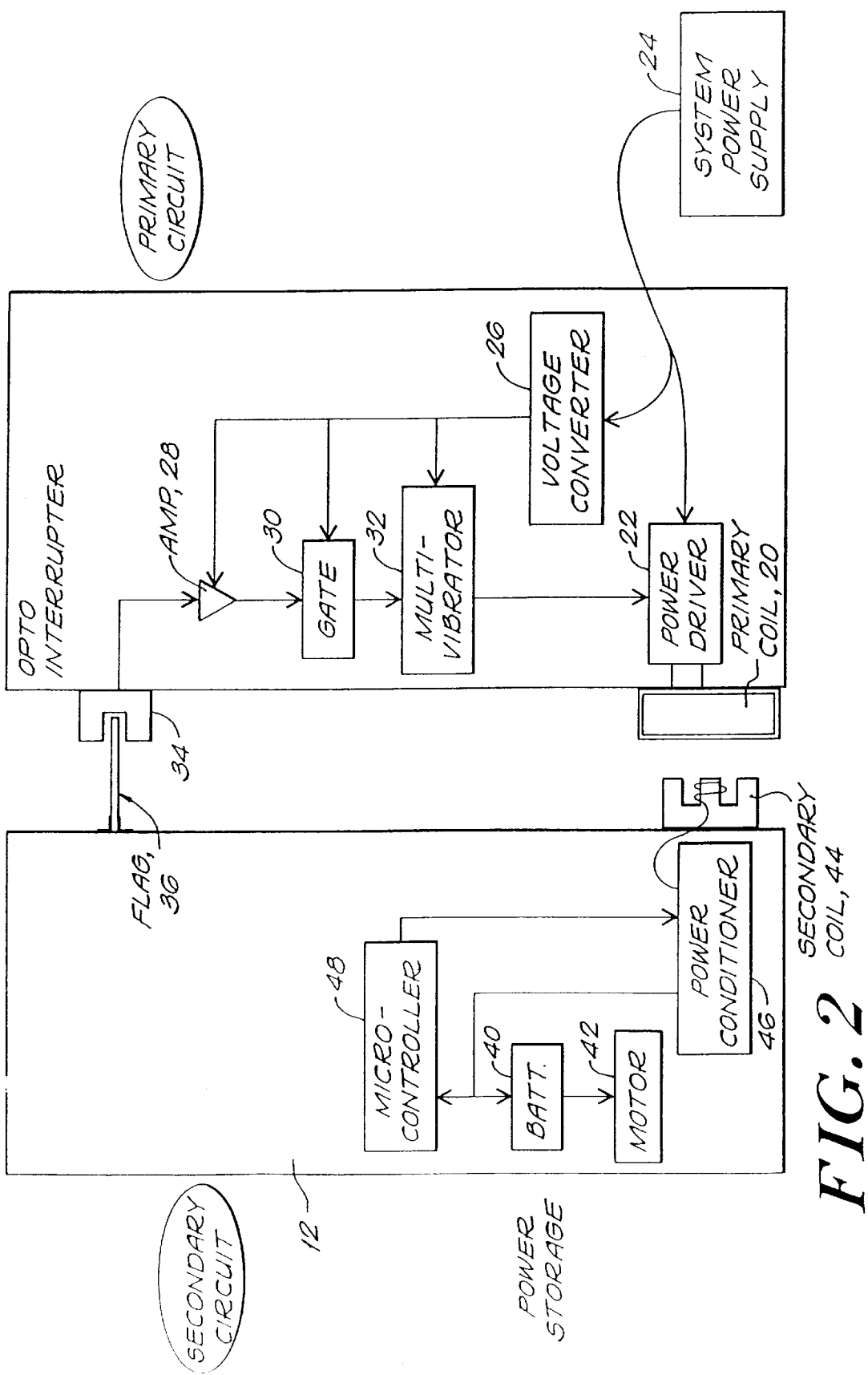
FIG. 2 is a block diagram of one embodiment of an inductive power transfer system in accordance with the invention.

As shown in FIG. 2, the charging station includes a primary coil 20 driven by a power driver 22. A system power supply 24 provides DC power to power driver 22 and to voltage converter 26 which in turn provides power to amplifier 28, gate 30 and multi-vibrator 32. An opto-interrupter 34 provides, in the presence of a flag 36 carried by car 38, a signal to amplifier 28 which in turn provides a signal to gate 30 and multi-vibrator 32 which provides a gating signal to the power driver 22. The power driver is triggered on for the duration of the gating signal to energize the primary coil 20 when a car is present at the charging station. The car 12 include a battery power source 40 or other energy source which provides power to the electric motor or motors 42 on board the car and which propel the car along the track.

A secondary coil 44 is disposed on the car in a position to be inductively coupled to the primary coil 20 when the car is in the charging position. The secondary coil is coupled to a power conditioner 46 which in turn provides charging current to the battery 40. A micro-controller 48 governs the operation of the power conditioner. The power driver 22 provides pulses to the primary coil 20 which provides corresponding pulses induced in the secondary coil which are processed by the power conditioner 46 to charge the on board battery 40. The power conditioning is governed by the micro-controller 48 in accordance with the particular battery and its charging characteristics. When the car leaves the charging station, the flag 36 moves out of coupling position with the opto-interrupter 34 and the power drive circuit 22 is gated off and remains off until another car arrives for charging. More than one secondary coil can be provided on the car. For example, a secondary coil can be associated with each truck on the car.

Figure 3:
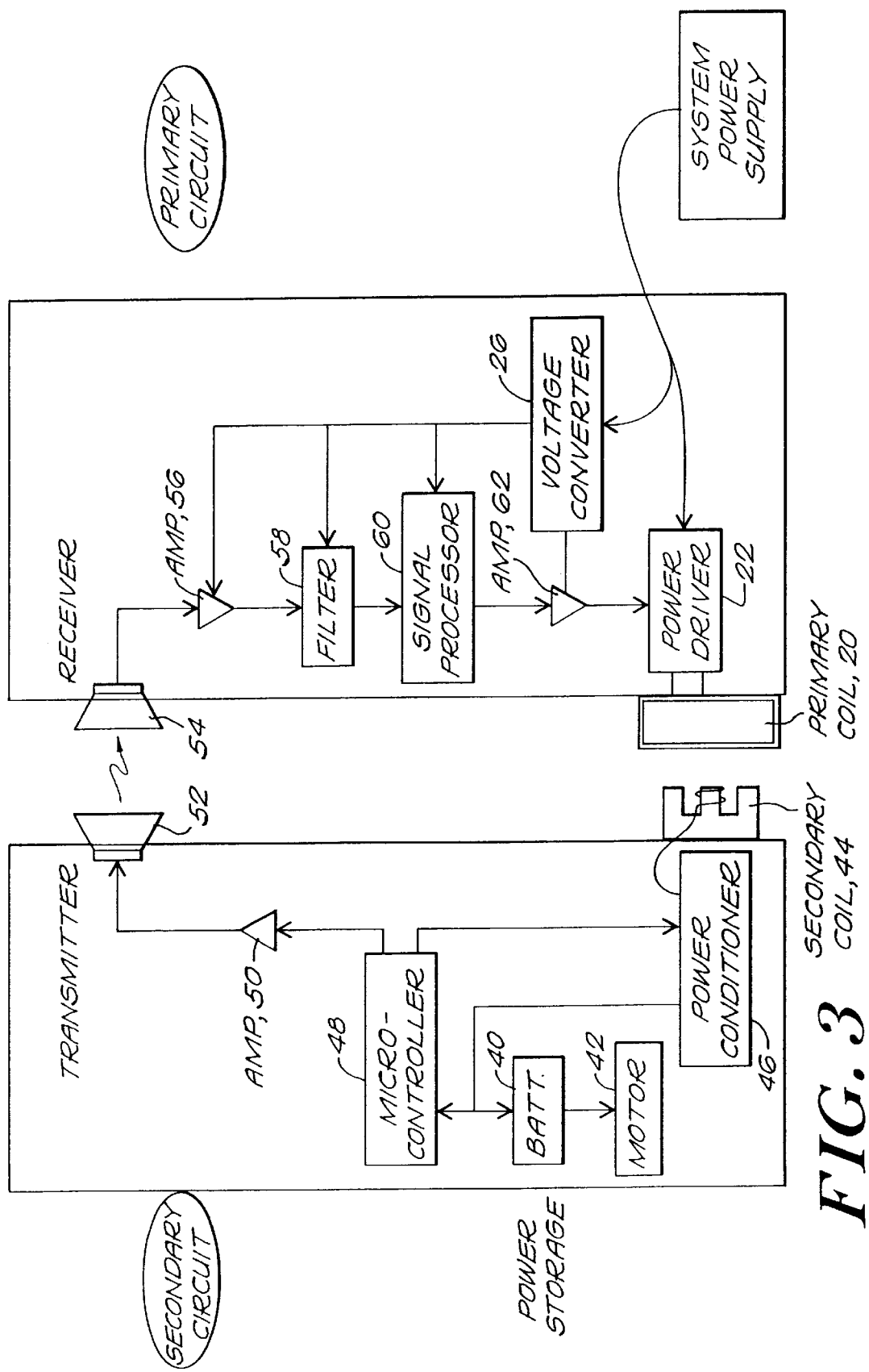
FIG. 3 is a block diagram of another embodiment of an inductive power transfer system in accordance with the invention.

In the embodiment shown in FIG. 3, feedback control is provided to monitor the charge on the battery 40 and to control the charging process. The system shown in FIG. 3 is similar to that of FIG. 2. In the embodiment of FIG. 3, the micro-controller 48 provides a signal via an amplifier 50 to a transmitter 52 which is coupled to a receiver 54 at the charging station when the car is in charging position at the station. The receiver 54 provides a control signal via an amplifier 56, filter 58, signal processor 60 and amplifier 62 to control the power driver 22 and thereby control power provided to energize the primary coil 20. The signals driving the primary coil typically have a pulse rate determined to control the amount of power transmitted by the primary coil to the secondary coil. The pulse rate is varied in accordance with the control signals derived from the feedback signal provided by the micro-controller 48 on the car. Alternatively, the pulses can have a variable pulse width to provide the intended charging current.

Figure 4:
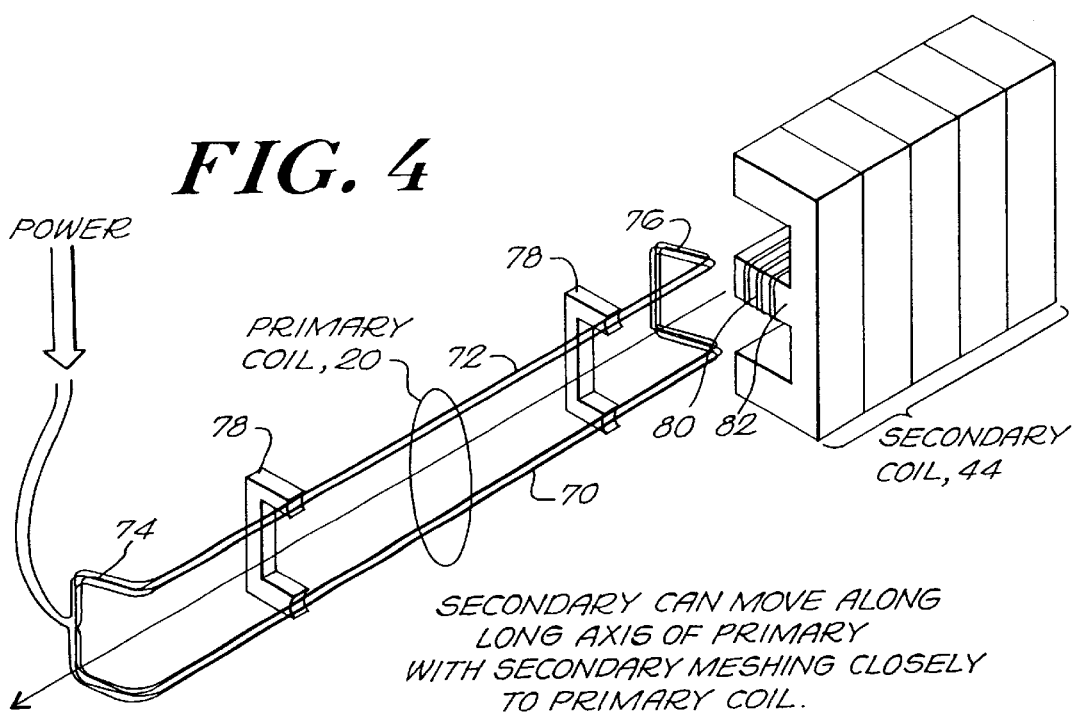
FIG. 4 is a pictorial illustration of one embodiment of a primary coil and secondary coil in accordance with the invention.

The primary and secondary coils are shown in FIG. 4. The primary coil 20 has first and second long sides 70 and 72 disposed parallel to the travel path along the track, and first and second ends 74 and 76 which are bent rearwardly as illustrated to provide a clear unobstructed coupling path for the moveable secondary coil 44. The primary coil is composed of multiple turns of insulated wire sufficient to provide an intended electromagnetic field in response to the drive signals provided to the coil. The coil can be mounted in any convenient manner on or adjacent to the track. In the illustrated embodiment of FIG. 4, the coils are supported on C-shaped brackets 78 which are attached to the track or a support structure associated with the track.

Figure 5:
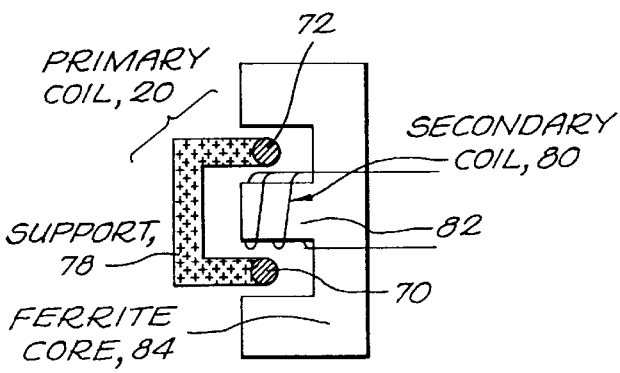
FIG. 5 is an elevation view of the embodiment of FIG. 4.

The secondary coil 80 is wound on the center leg of a shaped core 84. As illustrated in FIGS. 4 and 5, the coil 80 and the associated center leg of the core 82 are sized to move in coupling relationship along the length of the primary coil.

Figure 6:
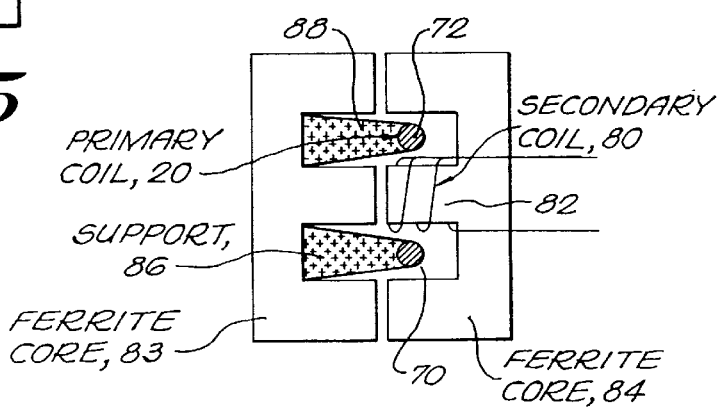
FIG. 6 is an elevation view of an alternative embodiment of the primary and secondary coils.

In an alternative embodiment, the primary coil can be mounted on a ferrite or other magnetic core. As shown in FIG. 6, a core 83 has legs 86 and 88 on which the long sides 70 and 72 of the primary coil are respectively supported. These long sides of the primary coil are in coupling relationship with the secondary coil in similar manner to the embodiment of FIG. 5, when the secondary coil is moved into position in nesting or meshing relationship with the primary coil.

Figure 7:
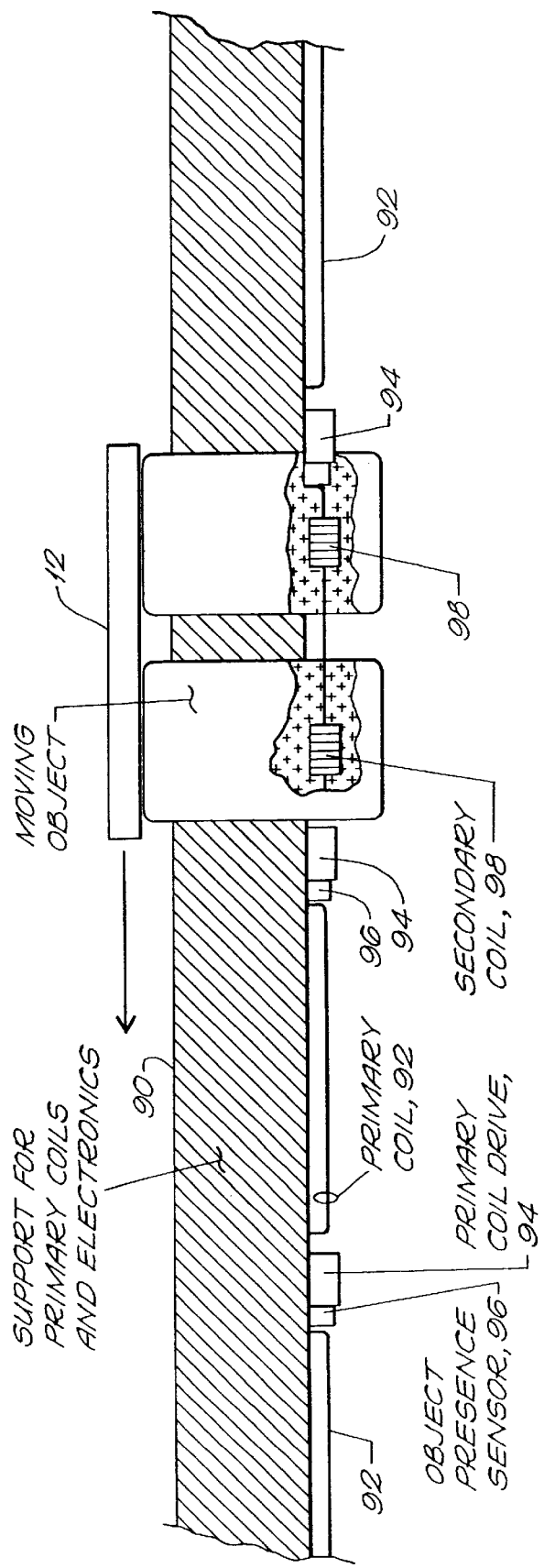
FIG. 7 is a cutaway partial sectioned elevation view of the invention in a typical mounting arrangement.

Referring to FIG. 7, there is shown one embodiment of a support 90 attached to or part of the track and along which are mounted a plurality of primary coils 92. Each primary coil has a coil drive circuit 94 and an object presence sensor 96. As described the object presence sensor is operative to energize the coil drive circuit when a car is detected and moves into charge coupling relationship at a charging station. The primary coils can be provided at selected positions along the track. Alternatively the primary coils may be provided along the entire track path or along any section thereof. Usually, the primary coils are located at wafer transfer points along the track at which a car can be stationary for a time sufficient to provide charging of the battery or batteries on the car. Primary coils along the entire track or relatively long sections of the track would allow charging even on the fly as a car moves along the track.

Referring again to FIG. 7, a car 12 is shown having first and second secondary coils 98. Each secondary coil is coupled to charging circuitry associated with a battery. The car in the illustrated embodiment has a single battery fed by parallel charging circuits of the secondary. The car can alternatively have a separate battery for each car motor which in turn has an associated charging circuit including the respective secondary coil.

While the invention has been described in relation to a semiconductor wafer handling system, it should be evident that the invention is also useful for other substrate or materials handling systems in which a car is moveable along a track. Accordingly, the invention is not to be limited by what has been particularly shown and described as variations and alternative implementations will occur to those versed in the art without departing from the spirit and true scope of the invention as represented by the appended claims.

What is claimed is:

1. An inductive power transfer apparatus for coupling electrical energy between a first position along a travel path and a unit which is moveable along the travel path, the apparatus comprising:

an elongated primary coil disposed at a first position along the travel path and having an unobstructed coupling path;

the unit moveable along the travel path, the unit having a secondary coil which when in the first position is in coupling relationship with the elongated primary coil at the unobstructed coupling path and the unit having an on-board rechargeable energy source directly electrically connected to a charging circuit, the charging circuit further coupled to the secondary coil, the on-board rechargeable energy source directly electrically connected to a motor, to provide the power thereto, wherein the motor is operative to move the unit along the travel path to provide the power thereto;

a drive circuit operative in response to DC power to provide drive signals to the primary coil to induce a charging current in the secondary coil when the secondary coil is coupled to the primary coil; and the secondary coil being operative to provide the charging current to the charging circuit in response to energy provided by the primary coil when in coupling relationship with the secondary coil, wherein the charging circuit charges the on-board rechargeable energy source in response to the charging current.

2. For use in a semiconductor wafer transport system having a track disposed along a predetermined path and one or more cars moveable along the track for movement of wafers to successive work stations and wherein each of the cars has at least one battery powered motor thereon for propulsion of the car along the track and for powering on-board circuitry on the car, an inductive power transfer apparatus for coupling electrical power from one or more positions along the track to the one or more cars, said apparatus comprising:

a primary coil disposed at each of one or more positions along a travel path;

the car moveable along the travel path, the car having a secondary coil which when in the one or more positions is in coupling relationship with the primary coil and the car having a battery source directly electrically connected to a charging circuit, the charging circuit coupled to the secondary coil, the battery source directly electrically connected to the battery powered motor to provide power thereto;

a drive circuit operative in response to DC power to provide drive signals to the one or more primary coils to induce a charging current in the secondary coil when coupled to the primary coil; and the secondary coil being operative to provide the charging current to the charging circuit in response to energy provided by the primary coil when in coupling relationship with the secondary coil, wherein the battery source is charged by the charging circuit in response to the charging current.

3. The apparatus of claim 2 wherein the primary coil has first and second long sides disposed parallel to the travel path and first and second ends which are disposed rearwardly of the travel path to provide an unobstructed coupling path for the secondary coil.

4. The apparatus of claim 3 wherein the primary coil is composed of multiple turns of insulated wire sufficient to provide an intended electromagnetic field in response to the drive signals.

5. The apparatus of claim 4 including a support for mounting the primary coil in predetermined position along the travel path.

6. The apparatus of claim 5 wherein the support for the primary coil is made of a non-conductive material.

7. The apparatus of claim 5 wherein the support for the primary coil is made of a magnetic material.

8. The apparatus of claim 3 wherein the secondary coil is wound on a leg of a shaped transformer core, the secondary coil and associated leg being sized to move in coupling relationship along the unobstructed coupling path of the primary coil.

9. The apparatus of claim 8 wherein the primary coil is wound on a leg of a transformer core.

10. The apparatus of claim 8 wherein the secondary coil is wound on a center leg of an E-shaped transformer core.

11. The apparatus of claim 8 wherein the transformer core of the secondary coil is made of a ferrite material.

12. The apparatus of claim 2 further including activation apparatus operative to activate the drive circuit when the primary coil is in coupling relationship with the secondary coil.

13. The apparatus of claim 12 wherein the activation apparatus includes a detector operative to sense the coupling position of the primary and secondary coils.

14. The apparatus of claim 13 wherein the detector is an opto interrupter.

15. The apparatus of claim 12 wherein the drive circuit is inactive except when activated by the primary and secondary coils being in coupling relationship as determined by an activation signal from the detector.

16. The apparatus of claim 2 wherein the battery charging circuit includes a circuit for control of the charging characteristics of the charging current.

17. The apparatus of claim 2 wherein the drive circuit is powered from a DC source and wherein the drive signals are drive pulses.

18. The apparatus of claim 2 further including feedback control circuitry operative to monitor the charge on the one or more batteries and to control the charging process.

19. The apparatus of claim 2 wherein each of the cars has a front and rear truck with wheels for engagement of the track and wherein each of the cars has a battery powered motor for each truck and a secondary coil for charging each battery powered motor.

20. The apparatus of claim 2 wherein each car includes circuitry operative to maintain battery charge status and to provide data to control the rate of charging appropriate to the charge status.

21. The apparatus of claim 2 wherein the drive signals are pulses having a rate effective to induce the intended charging current in the secondary coil.

22. The apparatus of claim 2 wherein the battery source includes a plurality of batteries.

23. The apparatus of claim 2 wherein the secondary coil is wound on the center leg of an E shaped transformer core and wherein the long sides of the primary coil are disposed in the gaps of the E shaped transformer core.

24. The apparatus of claim 2 wherein the drive circuit provides drive signals to a plurality of the primary coils.

25. The apparatus of claim 2 including a secondary circuit connected to the secondary coil and having a power conditioner receiving signals from the secondary coil induced from pulses provided to the primary coil, the power conditioner operative to provide the charging current to the battery source.

26. The apparatus of claim 2 wherein the drive signals are drive pulses.

* * * * *